United States Patent
Shiah et al.

(10) Patent No.: US 7,843,222 B1
(45) Date of Patent: Nov. 30, 2010

(54) BUFFER-DRIVING CIRCUIT CAPABLE OF INCREASING RESPONDING SPEED AND PROLONGING LIFESPAN, BUFFER, AND METHOD THEREOF

(75) Inventors: Chun Shiah, Hsinchu (TW); Tzu-Jen Ting, Taipei (TW); Yu-Hui Sung, Hsinchu County (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 12/582,718

(22) Filed: Oct. 21, 2009

(30) Foreign Application Priority Data

Aug. 6, 2009 (TW) .............................. 98126518 A

(51) Int. Cl.
*H03K 19/0175* (2006.01)

(52) U.S. Cl. .............................. 326/81; 326/83; 326/87

(58) Field of Classification Search .............. 326/81–87
See application file for complete search history.

(56) References Cited

U.S. PATENT DOCUMENTS

| 7,068,091 | B1 * | 6/2006 | Kwong | 327/333 |
|---|---|---|---|---|
| 7,088,167 | B2 * | 8/2006 | Itoh | 327/333 |
| 7,239,186 | B2 * | 7/2007 | Yu et al. | 327/112 |
| 2007/0008001 | A1 * | 1/2007 | Sanchez et al. | 326/80 |

* cited by examiner

*Primary Examiner*—Rexford N Barnie
*Assistant Examiner*—Thienvu V Tran
(74) *Attorney, Agent, or Firm*—Winston Hsu; Scott Margo

(57) ABSTRACT

A method for increasing responding speed and lifespan of a buffer includes detecting an edge of an input signal of the buffer, triggering a pulse signal with a predetermined period according to the detected edge, and driving the buffer for generating an output signal according to the pulse signal and the input signal.

18 Claims, 2 Drawing Sheets

BUFFER-DRIVING CIRCUIT CAPABLE OF INCREASING RESPONDING SPEED AND PROLONGING LIFESPAN, BUFFER, AND METHOD THEREOF

BACKGROUND OF THE INVENTION

1. Field of the Invention

The present invention is related to a buffer, and more particularly, to a buffer capable of increasing the responding speed and prolonging the lifespan.

2. Description of the Prior Art

In the design of a general buffer, the responding speed is limited by the bias voltage of the electrical components of the buffer. That is, if the bias voltage of the buffer is raised up, the responding speed of the buffer increases. However, in this way, the lifespan of the buffer is reduced, causing a great inconvenience.

SUMMARY OF THE INVENTION

The present invention provides a buffer-driving circuit capable of increasing a responding speed of a buffer circuit and a lifespan of the buffer circuit. The buffer circuit has a transmitting transistor and a voltage-sharing transistor. The transmitting transistor is coupled between a first voltage source and the voltage-sharing transistor. The voltage-sharing transistor is coupled between the transmitting transistor and an output end of the buffer circuit. The first voltage source provides a first voltage. The buffer circuit is utilized for buffering an input signal and accordingly generating an output signal from the output end of the buffer circuit. The buffer-driving circuit comprises a level-shifting circuit, a pulse generator, and a bias circuit. The level-shifting circuit is utilized for shifting a voltage level of the input signal so as to generate a level-shifting signal. When the voltage level of the input signal is equal to a first predetermined voltage level, the level-shifting signal is equal to the first voltage. When the voltage level of the input signal is equal to a second predetermined voltage level, the level-shifting signal is equal to a second voltage. The pulse generator is utilized for generating a pulse signal with a predetermined period when the input signal is in a transition state. The bias circuit comprises a first inverter, and a second inverter. The first inverter comprises an input end, an output end, a first power end, and a second power end. The input end of the first inverter is coupled to the level-shifting circuit for receiving the level-shifting signal. The output end of the first inverter is coupled to a control end of the transmitting transistor, for outputting a transmitting gate-driving signal so as to control the transmitting transistor. The first power end of the first inverter is coupled to the first voltage source, for receiving the first voltage. The second inverter comprises an input end, an output end, a first power end, and a second power end. The input end of the second inverter is coupled to the pulse generator, for receiving the pulse signal. The output end of the second inverter is coupled to a control end of the voltage-sharing transistor and the second power end of the first inverter, for outputting a voltage-sharing gate-driving signal. The first power end of the second inverter is coupled to a second voltage source, for receiving the second voltage. The second power end of the second inverter is coupled to a third voltage source, for receiving a third voltage. An amplitude of the transmitting gate-driving signal is between the first voltage and the voltage-sharing gate-driving signal. An amplitude of the voltage-sharing gate-driving signal is between the second voltage and the third voltage.

The present invention further provides a buffer with a fast responding speed and a long life span. The buffer is utilized for buffering an input signal so as to generate an output signal. The buffer comprises a buffer circuit, and a buffer-driving circuit. The buffer circuit comprises a P-type buffer circuit, and an N-type buffer circuit. The P-type buffer circuit comprises a P-type transmitting transistor, and a P-type voltage-sharing transistor. The P-type transmitting transistor comprises a first end, a second end, and a control end. The first end of the P-type transmitting transistor is coupled to a first voltage source, for receiving a first voltage. The control end of the P-type transmitting transistor is utilized for receiving a P-type transmitting gate-driving signal. The P-type voltage-sharing transistor comprises a first end, a second end, and a control end. The first end of the P-type voltage-sharing transistor is coupled to the second end of the P-type transmitting transistor. The second end of the P-type voltage-sharing transistor is coupled to an output end of the buffer, for receiving the output signal. The control end of the P-type voltage-sharing transistor is utilized for receiving a P-type voltage-sharing gate-driving signal. The N-type buffer circuit comprises an N-type transmitting transistor, and an N-type voltage-sharing transistor. The N-type transmitting transistor comprises a first end, a second end, and a control end. The first end of the N-type transmitting transistor is coupled to a second voltage source, for receiving a second voltage. The control end of the N-type transmitting transistor is utilized for receiving an N-type transmitting gate-driving signal. The N-type voltage-sharing transistor comprises a first end, a second end, and a control end. The first end of the N-type voltage-sharing transistor is coupled to the second end of the N-type transmitting transistor. The second end of the N-type voltage-sharing transistor is coupled to the output end of the buffer, for receiving the output signal. The control end of the N-type voltage-sharing transistor is utilized for receiving an N-type voltage-sharing gate-driving signal. The buffer-driving circuit comprises a P-type buffer-driving circuit, and an N-type buffer-driving circuit. The P-type buffer-driving circuit comprises a P-type level-shifting circuit, a P-type pulse generator, and a P-type bias circuit. The P-type level-shifting circuit is utilized for shifting a voltage level of the input signal so as to generate a P-type level shifting signal. When the voltage level of the input signal is equal to a first predetermined voltage level, the P-type level shifting signal is equal to the first voltage. When the voltage level of the input signal is equal to a second predetermined voltage level, the P-type level-shifting signal is equal to a third voltage. The P-type pulse generator is utilized for generating a P-type pulse signal with a first predetermined period according to a rising edge of the input signal. The P-type bias circuit comprises a first inverter, and a second inverter. The first inverter comprises an input end, an output end, a first power end, and a second power end. The input end of the first inverter is coupled to the P-type level-shifting circuit, for receiving the P-type level-shifting signal. The output end of the first inverter is coupled to the control end of the P-type transmitting transistor, for outputting the P-type transmitting gate-driving signal. The first power end of the first inverter is coupled to the first voltage source, for receiving the first voltage. The second inverter comprises an input end, an output end, a first power end, and a second power end. The input end of the second inverter is coupled to the P-type pulse generator, for receiving the P-type pulse signal. The output end of the second inverter is coupled to the control end of the P-type voltage-sharing transistor, for outputting the P-type voltage-sharing gate-driving signal. The first power end of the second inverter is coupled to a second voltage source, for receiving the second voltage. The second power end of the second inverter is coupled to a third voltage source, for receiving the third voltage. The N-type buffer-driving circuit comprises an N-type level-shifting circuit, an N-type pulse generator, and an N-type bias circuit. The N-type level-shifting circuit is utilized for shifting the voltage level of the output signal so as to generating an N-type level-shifting signal. When the voltage level of the input signal is equal to the first predetermined voltage level, the level-shifting signal is equal to a fourth voltage. When the voltage level of the input signal is equal to the second predetermined voltage level, the level-shifting signal is equal to the second voltage. The N-type pulse generator is utilized for generating an N-type pulse signal with a second predetermined period according to a falling edge of the input signal. The N-type bias circuit comprises a third inverter, and a fourth inverter. The third inverter comprises an input end, an output end, a first power end, and a second power end. The input end of the third inverter is coupled to the N-type level-shifting circuit, for receiving the N-type level-shifting signal. The output end of the third inverter is coupled to the control end of the N-type transmitting transistor, for outputting the N-type transmitting gate-driving signal. The first power end of the third inverter is coupled to the second voltage source, for receiving the second voltage. The fourth inverter comprises an input end, an output end, a first power end, and a second power end. The input end of the fourth inverter is coupled to the N-type pulse generator, for receiving the N-type pulse signal. The output end of the fourth inverter is coupled to the control end of the N-type voltage-sharing transistor, for outputting the N-type voltage-sharing gate-driving signal. The first power end of the fourth inverter is coupled to the first voltage source, for receiving the first voltage. The second power end of the fourth inverter is coupled to a fourth voltage source, for receiving the fourth voltage. An amplitude of the P-type transmitting gate-driving signal is between the first voltage and the P-type voltage-sharing gate-driving signal. An amplitude of the P-type voltage-sharing gate-driving signal is between the second voltage and the third voltage. An amplitude of the N-type transmitting gate-driving signal is between the second voltage and the N-type voltage-sharing gate-driving signal. An amplitude of the N-type voltage-sharing gate-driving signal is between the first voltage and the fourth voltage.

The present invention further provides a method capable of increasing a responding speed of a buffer and prolonging a lifespan of the buffer. The method comprises detecting an edge of an input signal of the buffer, triggering a pulse signal with a predetermined period according to the detected edge of the input signal, and driving the buffer according to the pulse signal and the input signal so as to generate an output signal.

The present invention further provides a buffer of buffering an input signal so as to generate an output signal from an output end. The buffer comprises a buffer-driving circuit, a transmitting transistor, and a voltage-sharing transistor. The buffer-driving circuit is utilized for receiving the input signal so as to generate a voltage-sharing gate-driving signal and a transmitting gate-driving signal. The transmitting transistor is coupled to a first voltage source, for receiving the transmitting gate-driving signal. The voltage-sharing transistor is coupled between the output end and the transmitting transistor, for receiving the voltage-sharing gate-driving signal. When the input signal is a first voltage, the transmitting gate-driving signal is equal to a first predetermined voltage during a first predetermined period, the transmitting driving signal is equal to a second predetermined voltage beyond the first predetermined period.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
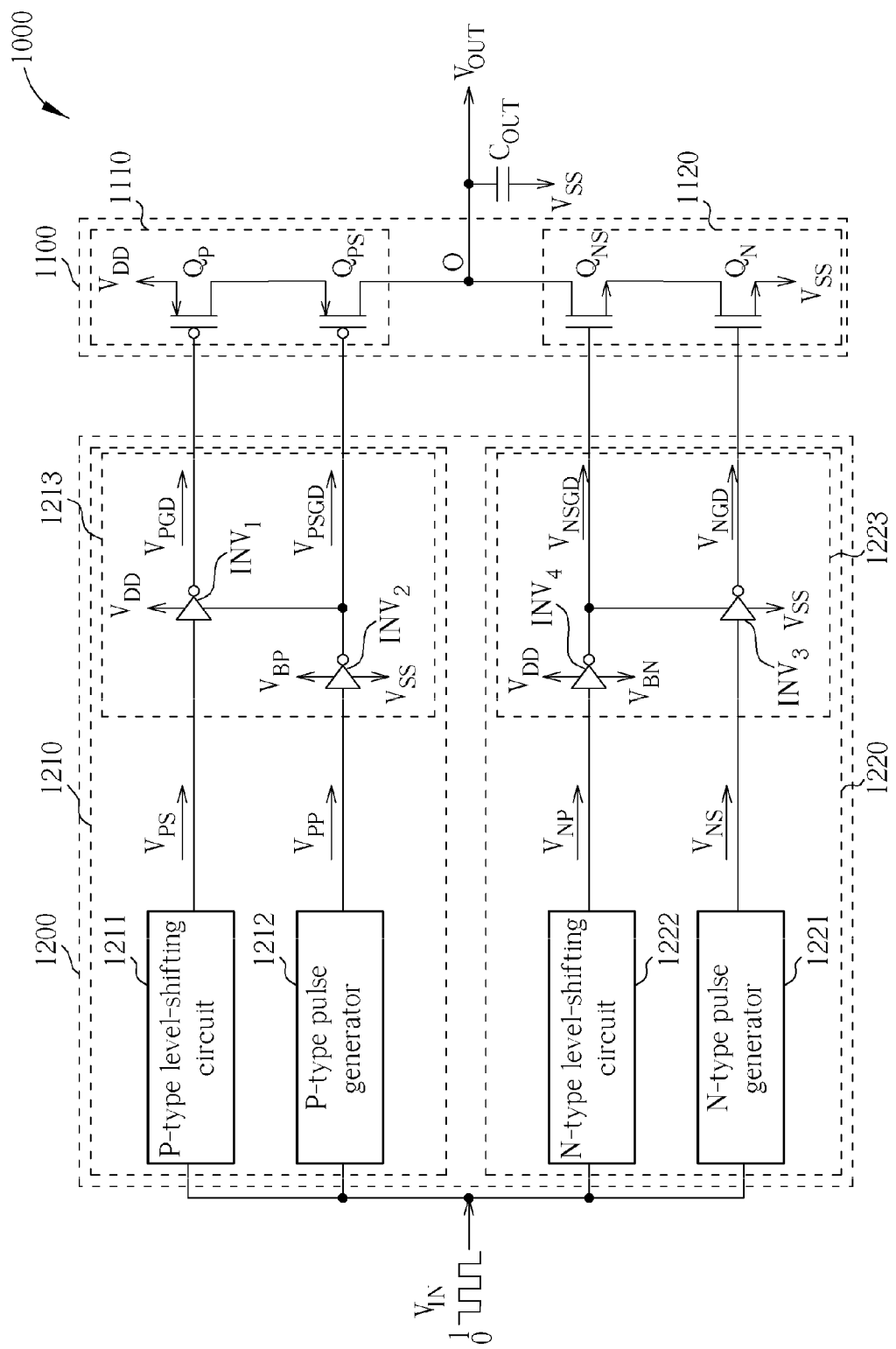
FIG. 1 is a diagram illustrating a buffer with a fast responding speed and a long lifespan of the present invention.

Please refer to FIG. 1. FIG. 1 is a diagram illustrating a buffer 1000 with a fast responding speed and a long lifespan of the present invention. As shown in FIG. 1, the buffer 1000 comprises a buffer circuit 1100, and a buffer-driving circuit 1200. The buffer 1000 is utilized for buffering an input signal $V_{IN}$ so as to output an output signal $V_{OUT}$. Since the low voltage level and the high voltage level of the input signal $V_{IN}$ can be designed as desired, the logic "0" and "1" is used for representing the low voltage level and the high voltage level of the input signal $V_{IN}$ in the present invention, respectively. The high voltage level of the output signal $V_{OUT}$ is $V_{DD}$ (the voltage provided by the voltage source $V_{DD}$), and the low voltage level of the output signal $V_{OUT}$ is $V_{SS}$ (the voltage provided by the voltage source $V_{SS}$). In addition, the voltage source $V_{SS}$ can be a ground end. The output end of the buffer 1000 is coupled to a capacitor $C_{OUT}$. The capacitor $C_{OUT}$ is coupled between the output end of the buffer 1000 and the voltage source $V_{SS}$.

The buffer circuit 1100 comprises a P-type buffer circuit 1110 and an N-type buffer circuit 1120. The P-type buffer circuit 1110 comprises a P-type transmitting transistor $Q_P$ and a P-type voltage-sharing transistor $Q_{PS}$. The N-type buffer circuit 1120 comprises an N-type transmitting transistor $Q_N$ and an N-type voltage-sharing transistor $Q_{NS}$. The transmitting transistors $Q_P$ and $Q_N$ are utilized for receiving the input signal $V_{IN}$ driven by the buffer-driving circuit 1200, respectively, and so as to generate the output signal $V_{OUT}$. The voltage-sharing transistors $Q_{PS}$ and $Q_{NS}$ are utilized for reducing the voltage drops across the transmitting transistors $Q_P$ and $Q_N$, respectively, for prolonging the lifespan of the transmitting transistors $Q_P$ and $Q_N$. The transmitting transistor $Q_P$ is coupled to the voltage source $V_{DD}$; the transmitting transistor $Q_N$ is coupled to the voltage source $V_{SS}$. Generally speaking, for increasing the responding speed of the buffer 1000, the voltage level of the voltage source $V_{DD}$ is raised up or the voltage level of the voltage source $V_{SS}$ is lowered down. However, this causes the voltage drops suffered by the transmitting transistors $Q_P$ and $Q_N$ increase at the same time, reducing the lifespan. Hence, the voltage-sharing transistors $Q_{PS}$ and $Q_{NS}$ are utilized for sharing the voltage drops across the transmitting transistors $Q_P$ and $Q_N$, respectively, for prolonging the lifespan of the transmitting transistors $Q_P$ and $Q_N$. For the normal operation of the transmitting transistors $Q_P$ and $Q_N$, the voltage-sharing transistors $Q_{PS}$ and $Q_{NS}$ have to be biased properly. Thus, in the buffer-driving circuit 1200, two voltage sources $V_{BP}$ and $V_{BN}$ (respectively for providing the voltage $V_{BP}$ and $V_{BN}$) are required for properly biasing the voltage-sharing transistors $Q_{PS}$ and $Q_{NS}$. In addition, the transistors $Q_P$ and $Q_{PS}$ can be P channel Metal Oxide Semiconductor (PMOS) transistors; the transistors $Q_N$ and $Q_{NS}$ can be N channel Metal Oxide Semiconductor (NMOS) transistors.

The buffer-driving circuit 1200 comprises a P-type buffer-driving circuit 1210 and an N-type buffer-driving circuit 1220 for driving the P-type buffer circuit 1110 and the N-type buffer circuit 1120, respectively. The P-type buffer-driving circuit 1210 comprises a P-type level-shifting circuit 1211, a P-type pulse generator 1212, and a P-type bias circuit 1213. The N-type buffer-driving circuit 1220 comprises an N-type level-shifting circuit 1221, an N-type pulse generator 1222, and an N-type bias circuit 1223.

In the present embodiment, the P-type level-shifting circuit 1211 shifts the voltage level of the input signal $V_{IN}$ for outputting the P-type level-shifting signal $V_{PS}$: when the input signal $V_{IN}$ represents logic "0", the voltage level of the level-shifting signal $V_{PS}$ is equal to the voltage $V_{BP}$ (provided by the voltage source $V_{BP}$, wherein the voltage level of the voltage $V_{BP}$ is between the voltage $V_{DD}$ and the voltage $V_{SS}$); when the input signal $V_{IN}$ represents logic "1", the voltage level of the level-shifting signal $V_{PS}$ is equal to the voltage $V_{DD}$ (provided by the voltage source $V_{DD}$).

The P-type pulse generator 1212 generates the P-type pulse signal $V_{PP}$ according to the transition of the input signal $V_{IN}$: when the input signal $V_{IN}$ changes from representing logic "0" to logic "1" (that is, when the rising edge of the input signal $V_{IN}$ occurs), the P-type pulse generator 1212 triggers the P-type pulse signal $V_{PP}$ (edge trigger). The high voltage level of the P-type pulse signal $V_{PP}$ is equal to the voltage $V_{BP}$, and the low voltage level of the P-type pulse signal $V_{PP}$ is equal to the voltage $V_{SS}$; the pulse width of the P-type pulse signal $V_{PP}$ is equal to a predetermined period $T_P$, and the P-type pulse signal $V_{PP}$ is a rising pulse signal.

The P-type bias circuit 1213 comprises inverters $INV_1$ and $INV_2$. The inverter $INV_1$ is mainly utilized for converting the P-type level-shifting signal $V_{PS}$ into the P-type transmitting gate-driving signal $V_{PGD}$ so as to drive the transmitting transistor $Q_P$. The inverter $INV_2$ is mainly utilized for converting the P-type pulse signal $V_{PP}$ into the P-type voltage-sharing gate-driving signal $V_{PSGD}$ so as to bias the voltage-sharing transistor $Q_{PS}$.

More particularly, the input end of the inverter $INV_1$ is utilized for receiving the P-type level-shifting signal $V_{PS}$; the output end of the inverter $INV_1$ is coupled to the control end (gate) of the transmitting transistor $Q_P$ for outputting the P-type transmitting gate-driving signal $V_{PGD}$ so as to control the transmitting transistor $Q_P$. In addition, the power ends of the inverter $INV_1$ are coupled to the voltage sources $V_{DD}$ and the output end of the inverter $INV_2$. Hence, although the transmitting gate-driving signal $V_{PGD}$ is inverted to the P-type level-shifting signal $V_{PS}$, the amplitude of the transmitting gate-driving signal $V_{PGD}$ is limited between the voltage level of the voltage source $V_{DD}$ and the signal outputted by the inverter $INV_2$.

The input end of the inverter $INV_2$ is utilized for receiving the P-type pulse signal $V_{PP}$ and accordingly inverting the P-type pulse signal $V_{PP}$ so as to output the voltage-sharing gate-driving signal $V_{PSGD}$. The power ends of the inverter $INV_2$ are coupled to the voltage source $V_{BP}$ and $V_{SS}$. Therefore, the amplitude of the voltage-sharing gate-driving signal $V_{PSGD}$ is limited between the voltages $V_{BP}$ and $V_{SS}$. Consequently, when the voltage level of the voltage-sharing gate-driving signal $V_{PSGD}$ is equal to the voltage $V_{BP}$, the amplitude of the transmitting gate-driving signal $V_{PGD}$ is between the voltages $V_{DD}$ and $V_{BP}$; when the voltage level of the voltage-sharing gate-driving signal $V_{PSGD}$ is equal to the voltage $V_{SS}$, the amplitude of the transmitting gate-driving signal $V_{PGD}$ is between the voltages $V_{DD}$ and $V_{SS}$.

As a result, in the P-type buffer-driving circuit 1210, when the input signal $V_{IN}$ is in the transition state (the rising edge), the received transmitting gate-driving signal $V_{PGD}$ of the transmitting transistor $Q_P$ can be lowered more (lower than the voltage $V_{BP}$) through the P-type pulse signal $V_{PP}$ generated by the P-type pulse generator. In this way, the transmitting transistor $Q_P$ can be turned on more completely so that the current passing through the transmitting transistor $Q_P$ becomes larger, increasing the speed of charging the capacitor $V_{OUT}$ and accelerating the responding speed of the buffer 1000.

The N-type level-shifting circuit 1221 shifts the voltage level of the input signal $V_{IN}$ for outputting the N-type level-shifting signal $V_{NS}$: when the input signal $V_{IN}$ represents logic "1", the voltage level of the level-shifting signal $V_{NS}$ is equal to the voltage $V_{BN}$ (provided by the voltage source $V_{BN}$, wherein the voltage level of the voltage $V_{BN}$ is between the voltages $V_{DD}$ and $V_{SS}$); when the input signal $V_{IN}$ represents logic "0", the voltage level of the level-shifting signal $V_{NS}$ is equal to the voltage $V_{SS}$ (provided by the voltage source $V_{SS}$).

The N-type pulse generator 1222 generates the N-type pulse signal $V_{NP}$ according to the transition of the input signal $V_{IN}$: when the input signal $V_{IN}$ changes from representing logic "1" to logic "0" (that is, when the falling edge of the input signal $V_{IN}$ occurs), the N-type pulse generator 1222 triggers the N-type pulse signal $V_{NP}$ (edge trigger). The high voltage level of the N-type pulse signal $V_{NP}$ is equal to the voltage $V_{DD}$, and the low voltage level of the N-type pulse signal $V_{NP}$ is equal to the voltage $V_{BN}$; the period length of the N-type pulse signal $V_{NP}$ is equal to the predetermined period $T_P$, similarly. The N-type pulse signal $V_{NP}$ is a falling pulse signal.

The N-type bias circuit 1223 comprises inverters $INV_3$ and $INV_4$. The inverter $INV_3$ is mainly utilized for converting the N-type level-shifting signal $V_{NS}$ into the N-type transmitting gate-driving signal $V_{NGD}$ so as to drive the transmitting transistor $Q_N$. The inverter $INV_4$ is mainly utilized for converting the N-type pulse signal $V_{NP}$ into the N-type voltage-sharing gate-driving signal $V_{NSGD}$ so as to bias the voltage-sharing transistor $Q_{NS}$.

More particularly, the input end of the inverter $INV_3$ is utilized for receiving the N-type level-shifting signal $V_{NS}$; the output end of the inverter $INV_3$ is coupled to the control end (gate) of the transmitting transistor $Q_N$ for outputting the N-type transmitting gate-driving signal $V_{NGD}$ so as to control the transmitting transistor $Q_N$. In addition, the power ends of the inverter $INV_3$ are coupled to the voltage source $V_{SS}$ and the output end of the inverter $INV_4$. Hence, although the transmitting gate-driving signal $V_{NGD}$ is inverted to the N-type level-shifting signal $V_{NS}$, the amplitude of the transmitting gate-driving signal $V_{NGD}$ is limited between the voltage level of the voltage source $V_{SS}$ and the signal outputted by the inverter $INV_4$.

The input end of the inverter $INV_4$ is utilized for receiving the N-type pulse signal $V_{NP}$ and accordingly inverting the N-type pulse signal $V_{NP}$ so as to output the voltage-sharing gate-driving signal $V_{NSGD}$. The power ends of the inverter $INV_4$ are coupled to the voltage sources $V_{DD}$ and $V_{BN}$. Therefore, the amplitude of the voltage-sharing gate-driving signal $V_{NSGD}$ is limited between the voltages $V_{BP}$ and $V_{SS}$. Consequently, when the voltage level of the voltage-sharing gate-driving signal $V_{NSGD}$ is equal to the voltage $V_{BN}$, the amplitude of the transmitting gate-driving signal $V_{NGD}$ is between the voltages $V_{SS}$ and $V_{BN}$; when the voltage level of the voltage-sharing gate-driving signal $V_{NSGD}$ is equal to the voltage $V_{DD}$, the amplitude of the transmitting gate-driving signal $V_{NGD}$ is between the voltages $V_{DD}$ and $V_{SS}$.

As a result, in the N-type buffer-driving circuit 1220, when the input signal $V_{IN}$ is in the transition state (the falling edge), the received transmitting gate-driving signal $V_{NGD}$ of the transmitting transistor $Q_N$ can be raised up more (higher than the voltage $V_{BN}$) through the N-type pulse signal $V_{NP}$ generated by the N-type pulse generator. In this way, the transmitting transistor $Q_N$ can be turned on more completely so that the current passing through the transmitting transistor $Q_N$ becomes larger, increasing the speed of discharging the capacitor $V_{OUT}$ and accelerating the responding speed of the buffer 1000.

According to the above-mentioned description, the basic idea of the buffer-driving circuit of the present invention is to generate the pulse signal when the input signal is in the transition state for enhancing the amplitude of the control signal for the buffer circuit so as to increase the responding speed of the buffer of the present invention.

In addition, the period length $T_P$ of the P-type pulse signal $V_{PP}$ and the N-type pulse signal $V_{NP}$ can be adjusted. If the user is to accelerate the responding speed of the buffer of the present invention, the period length $T_P$ can be prolonged; otherwise, if the user is to prolong the lifespan of the components of the buffer of the present invention, the period length $T_P$ can be shortened. The above-mentioned condition can be adjusted as desired. In other words, the buffer provided by the present invention is more flexible for designs. Furthermore, in the above-mentioned embodiment, although the period length of the P-type pulse signal $V_{PP}$ and the N-type pulse signal $V_{NP}$ are both equal to $T_P$, however, the period length of the P-type pulse signal $V_{PP}$ and the N-type pulse signal $V_{NP}$ can be designed to be different in the practical application according the requirement. For example, if the aspect ratios of the PMOS transistor and the NMOS transistor of the buffer circuit are not matching, the pulse widths of the N-type pulse signal $V_{PP}$ and the N-type pulse signal $V_{NP}$ have to be properly adjusted for the rising speed of the output signal $V_{OUT}$ equal to the falling speed of the output signal $V_{OUT}$.

It is noticeable that the application range of the buffer-driving circuit of the buffer of the present invention is related to the transition frequency of the input signal $V_{IN}$. More particularly, if the transition frequency of the input signal $V_{IN}$ is too high, that is, the period length of the input signal $V_{IN}$ in the logic "0" state or logic "1" state may be shorter than the period length of the P-type pulse signal $V_{PP}$ and the N-type pulse signal $V_{NP}$, the buffer of the present invention may operate incorrectly. Thus, the pulse widths of the pulse signals of the present invention are limited by the shortest period that the input signal $V_{IN}$ is in the logic "0" state or the logic "1" state. However, in the practical application of the digital circuit, the shortest period of the input signal $V_{IN}$ in the logic "0" state or the logic "1" state is predetermined. Hence, the period length (pulse width) of the pulse signals can be designed according to the shortest period. For instance, in the design of the digital circuit, the shortest period of the input signal $V_{IN}$ in the logic "0" state or the logic "1" state is equal to a fixed cycle. Thus, as long as the period length of the pulse signals are not longer than the fixed cycle, the buffer of the present invention can operate correctly.

Figure 2:
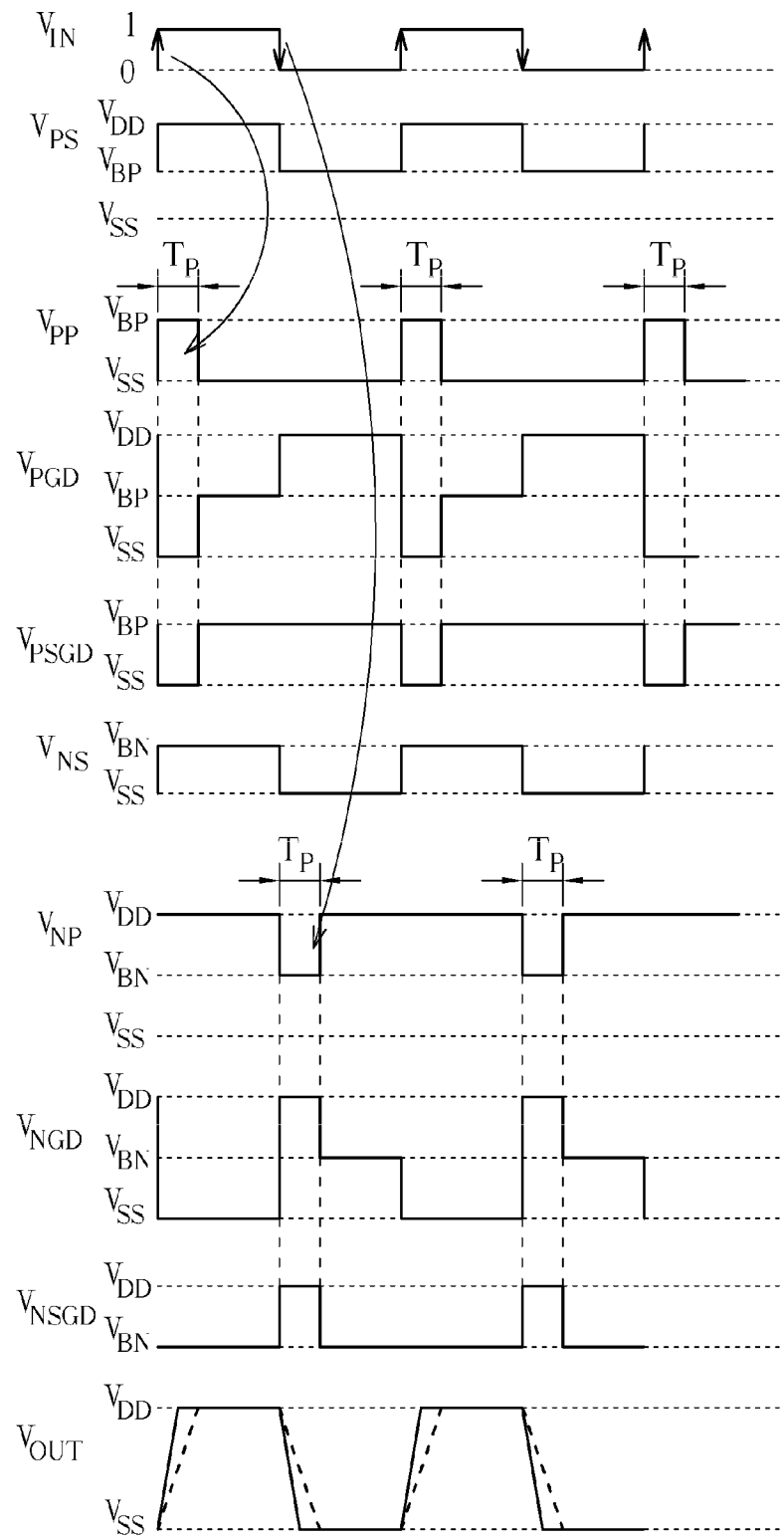
FIG. 2 is a time diagram illustrating the relation between the signals in the buffer of the present invention.

Please refer to FIG. 2. FIG. 2 is a time diagram illustrating the relation between the signals in the buffer of the present invention. As shown in FIG. 2, when the input signal $V_{IN}$ changes from logic "0" into logic "1" (the rising edge), the P-type pulse generator 1212 is triggered to generate a pulse (signal $V_{PP}$) going up from the voltage $V_{SS}$ to the voltage $V_{BP}$ with the predetermined period $T_P$. This pulse causes that the voltage-sharing gate-driving signal $V_{PSGD}$ goes down from the voltage $V_{BP}$ to the voltage $V_{SS}$, and the transmitting gate-driving signal $V_{PGD}$ simultaneously goes down to the voltage $V_{SS}$, so that the transmitting transistor $Q_P$ is turned on more completely. In this way, more currents flow from the voltage source $V_{DD}$ to the output end O of the buffer 1000 through the voltage-sharing transistor $Q_{PS}$, increasing the speed of charging the capacitor $C_{OUT}$. For instance, it can be seen that in the output signal $V_{OUT}$ of FIG. 2, the rising speed of the first rising edge of the output signal $V_{OUT}$ is faster than the rising speed of the output signal of a conventional buffer (shown by the dot line) because of the P-type pulse signal. When the input signal $V_{IN}$ changes from logic "1" into logic "0" (the falling edge), the N-type pulse generator 1222 is triggered to generate a pulse (signal $V_{NP}$) going down from the voltage $V_{DD}$ to the voltage $V_{BN}$ with the predetermined period $T_P$. This pulse causes that the voltage-sharing gate-driving signal $V_{NSGD}$ goes up from the voltage $V_{BN}$ to the voltage $V_{DD}$, and the transmitting gate-driving signal $V_{NGD}$ simultaneously goes up to the voltage $V_{DD}$, so that the transmitting transistor $Q_N$ is turned on more completely. In this way, more currents drains from the output end O of the buffer 1000 to the voltage source $V_{SS}$ through the voltage-sharing transistor $Q_{NS}$, increasing the speed of discharging the capacitor $C_{OUT}$. For instance, it can be seen that in the output signal $V_{OUT}$ of FIG. 2, the falling speed of the first falling edge of the output signal $V_{OUT}$ is faster than the falling speed of the output signal of a conventional buffer (shown by the dot line) because of the N-type pulse signal.

In conclusion, the buffer-driving circuit provided by the present invention can increase the responding speed of the buffer and prolong the life span of the buffer. In other words, the responding speed of the buffer increases and the lifespan of the buffer is prolonged by means of the pulse signals provided by the buffer-driving circuit. If the user is to accelerate the responding speed of the buffer, the pulse widths of the pulse signals can be prolonged; otherwise, if the user is to prolong the lifespan of the components of the buffer circuit, the pulse widths of the pulse signal can be shortened. The above-mentioned condition can be adjusted as desired. In other words, the buffer-driving circuit and the buffer provided by the present invention are more flexible for designs, providing a great convenience.

Those skilled in the art will readily observe that numerous modifications and alterations of the device and method may be made while retaining the teachings of the invention.

What is claimed is:

1. A buffer-driving circuit capable of increasing a responding speed of a buffer circuit and a lifespan of the buffer circuit, the buffer circuit having a transmitting transistor and a voltage-sharing transistor, the transmitting transistor coupled between a first voltage source and the voltage-sharing transistor, the voltage-sharing transistor coupled between the transmitting transistor and an output end of the buffer circuit, the first voltage source providing a first voltage, the buffer circuit utilized for buffering an input signal and accordingly generating an output signal from the output end of the buffer circuit, the buffer-driving circuit comprising:

a level-shifting circuit, for shifting a voltage level of the input signal so as to generate a level-shifting signal;
wherein when the voltage level of the input signal is equal to a first predetermined voltage level, the level-shifting signal is equal to the first voltage; when the voltage level of the input signal is equal to a second predetermined voltage level, the level-shifting signal is equal to a second voltage;

a pulse generator, for generating a pulse signal with a predetermined period when the input signal is in a transition state; and a bias circuit, comprising:
a first inverter, comprising:
an input end, coupled to the level-shifting circuit, for receiving the level-shifting signal;

an output end, coupled to a control end of the transmitting transistor, for outputting a transmitting gate-driving signal so as to control the transmitting transistor;

a first power end, coupled to the first voltage source, for receiving the first voltage; and a second power end; and a second inverter, comprising:

an input end, coupled to the pulse generator, for receiving the pulse signal;

an output end, coupled to a control end of the voltage-sharing transistor and the second power end of the first inverter, for outputting a voltage-sharing gate-driving signal;

a first power end, coupled to a second voltage source, for receiving the second voltage; and a second power end, coupled to a third voltage source, for receiving a third voltage;

wherein an amplitude of the transmitting gate-driving signal is between the first voltage and the voltage-sharing gate-driving signal;

wherein an amplitude of the voltage-sharing gate-driving signal is between the second voltage and the third voltage.

2. The buffer-driving circuit of claim 1, wherein when the predetermined period of the pulse signal increases, the responding speed of the buffer circuit increases.

3. The buffer-driving circuit of claim 1, wherein when the predetermined period of the pulse signal decreases, the lifespan of the buffer circuit is prolonged.

4. The buffer-driving circuit of claim 1, wherein the first predetermined voltage level is a high voltage level; the second predetermined voltage level is a low voltage level.

5. The buffer-driving circuit of claim 4, wherein when the pulse generator detects a rising edge of the input signal, the pulse generator generates the pulse signal, the pulse signal is a rising pulse signal, and an amplitude of the pulse signal is between the first voltage and the third voltage.

6. The buffer-driving circuit of claim 5, wherein the first voltage is a high voltage, the third voltage is a low voltage, and the second voltage is between the first voltage and the third voltage.

7. The buffer-driving circuit of claim 6, wherein the transmitting transistor and the voltage-sharing transistor are both PMOS transistors.

8. The buffer-driving circuit of claim 1, wherein the first predetermined voltage level is a low voltage level; the second predetermined voltage level is a high voltage level.

9. The buffer-driving circuit of claim 8, wherein when the pulse generator detects a falling edge of the input signal, the pulse generator generates the pulse signal, the pulse signal is a falling pulse signal, and an amplitude of the pulse signal is between the second voltage and the third voltage.

10. The buffer-driving circuit of claim 9, wherein the first voltage is a low voltage, the third voltage is a high voltage, and the second voltage is between the first voltage and the third voltage.

11. The buffer-driving circuit of claim 10, wherein the transmitting transistor and the voltage-sharing transistor are both NMOS transistors.

12. A buffer with a fast responding speed and a long life span for buffering an input signal so as to generate an output signal, the buffer comprising:

a buffer circuit, comprising:

a P-type buffer circuit, comprising:

a P-type transmitting transistor, comprising:

a first end, coupled to a first voltage source, for receiving a first voltage;

a second end; and a control end, for receiving a P-type transmitting gate-driving signal; and a P-type voltage-sharing transistor, comprising:

a first end, coupled to the second end of the P-type transmitting transistor;

a second end, coupled to an output end of the buffer, for generating the output signal; and a control end, for receiving a P-type voltage-sharing gate-driving signal; and an N-type buffer circuit, comprising:

an N-type transmitting transistor, comprising:

a first end, coupled to a second voltage source, for receiving a second voltage;

a second end; and a control end, for receiving an N-type transmitting gate-driving signal; and an N-type voltage-sharing transistor, comprising:

a first end, coupled to the second end of the N-type transmitting transistor;

a second end, coupled to the output end of the buffer, for generating the output signal; and a control end, for receiving an N-type voltage-sharing gate-driving signal; and a buffer-driving circuit, comprising:

a P-type buffer-driving circuit, comprising:

a P-type level-shifting circuit, for shifting a voltage level of the input signal so as to generate a P-type level shifting signal;

wherein when the voltage level of the input signal is equal to a first predetermined voltage level, the P-type level shifting signal is equal to the first voltage; when the voltage level of the input signal is equal to a second predetermined voltage level, the P-type level-shifting signal is equal to a third voltage;

a P-type pulse generator, for generating a P-type pulse signal with a first predetermined period according to a rising edge of the input signal; and a P-type bias circuit, comprising:

a first inverter, comprising:

an input end, coupled to the P-type level-shifting circuit, for receiving the P-type level-shifting signal;

an output end, coupled to the control end of the P-type transmitting transistor, for outputting the P-type transmitting gate-driving signal;

a first power end, coupled to the first voltage source, for receiving the first voltage; and a second power end; and a second inverter, comprising:

an input end, coupled to the P-type pulse generator, for receiving the P-type pulse signal;

an output end, coupled to the control end of the P-type voltage-sharing transistor and the second power end of the first inverter, for outputting the P-type voltage-sharing gate-driving signal;

a first power end, coupled to a second voltage source, for receiving the second voltage; and a second power end, coupled to a third voltage source, for receiving the third voltage; and an N-type buffer-driving circuit, comprising:
an N-type level-shifting circuit, for shifting the voltage level of the output signal so as to generating an N-type level-shifting signal;
wherein when the voltage level of the input signal is equal to the first predetermined voltage level, the level-shifting signal is equal to a fourth voltage; when the voltage level of the input signal is equal to the second predetermined voltage level, the level-shifting signal is equal to the second voltage;
an N-type pulse generator, for generating an N-type pulse signal with a second predetermined period according to a falling edge of the input signal;
an N-type bias circuit, comprising:
a third inverter, comprising:
an input end, coupled to the N-type level-shifting circuit, for receiving the N-type level-shifting signal;
an output end, coupled to the control end of the N-type transmitting transistor, for outputting the N-type transmitting gate-driving signal;
a first power end, coupled to the second voltage source, for receiving the second voltage; and
a second power end; and
a fourth inverter, comprising:
an input end, coupled to the N-type pulse generator, for receiving the N-type pulse signal;
an output end, coupled to the control end of the N-type voltage-sharing transistor and the second power end of the third transistor, for outputting the N-type voltage-sharing gate-driving signal;
a first power end, coupled to the first voltage source, for receiving the first voltage; and
a second power end, coupled to a fourth voltage source, for receiving the fourth voltage;

wherein an amplitude of the P-type transmitting gate-driving signal is between the first voltage and the P-type voltage-sharing gate-driving signal;
wherein an amplitude of the P-type voltage-sharing gate-driving signal is between the second voltage and the third voltage;
wherein an amplitude of the N-type transmitting gate-driving signal is between the second voltage and the N-type voltage-sharing gate-driving signal;
wherein an amplitude of the N-type voltage-sharing gate-driving signal is between the first voltage and the fourth voltage.

13. The buffer of the claim 12, wherein when the first and the second predetermined periods are prolonged, the responding speed of the buffer circuit increases.

14. The buffer of the claim 12, wherein when the first and the second predetermined periods are shortened, the lifespan of the buffer circuit is prolonged.

15. The buffer of claim 12, wherein the first predetermined voltage level is a high voltage level; the second predetermined voltage level is a low voltage level.

16. The buffer of claim 12, wherein the P-type pulse signal is a rising pulse signal, and the amplitude of the P-type pulse signal is between the first voltage and the third voltage; the N-type pulse signal is a falling pulse signal, and the amplitude of the N-type pulse signal is between the second voltage and the fourth voltage; the third voltage and the fourth voltage is between the first voltage and the second voltage.

17. The buffer of claim 12, wherein period length first predetermined period can be equal to the second predetermined period.

18. The buffer of claim 12, wherein period length first predetermined period can be different from the second predetermined period.

* * * * *